United States Patent [19]

Booth et al.

[11] Patent Number: 5,015,059
[45] Date of Patent: May 14, 1991

[54] OPTICAL FIBER CONNECTOR ASSEMBLIES AND METHODS OF MAKING THE ASSEMBLIES

[75] Inventors: Bruce L. Booth, West Chester, Pa.; Joseph E. Marchegiano, Wilmington, Del.

[73] Assignee: E. I. Du Pont de Nemours and Company, Wilmington, Del.

[21] Appl. No.: 360,048

[22] Filed: Jun. 1, 1989

Related U.S. Application Data

[62] Division of Ser. No. 144,002, Jan. 15, 1988, Pat. No. 4,883,743.

[51] Int. Cl.$^5$ .............................................. G02B 6/30
[52] U.S. Cl. .................................. 350/96.17; 430/321; 350/46.21
[58] Field of Search ............... 350/96.17, 96.20, 96.21, 350/96.22; 430/321

[56] References Cited

U.S. PATENT DOCUMENTS

| | | | |
|---|---|---|---|
| 3,469,982 | 9/1969 | Celeste | 96/35.1 |
| 3,526,504 | 9/1970 | Celeste | 96/35.1 |
| 3,658,526 | 4/1972 | Haugh | 96/27 |
| 3,674,336 | 7/1972 | Kogelnik | 350/96 |
| 3,689,264 | 9/1972 | Chandross et al. | 96/35.1 |
| 3,770,438 | 11/1973 | Celeste | 96/67 |
| 3,809,686 | 5/1974 | Chandross et al. | 260/89.5 |
| 3,809,732 | 5/1974 | Chandross et al. | 264/22 |
| 3,955,015 | 5/1976 | Ohtsuka et al. | 427/163 |
| 3,993,485 | 11/1976 | Chandross et al. | 96/27 |
| 4,017,158 | 4/1977 | Booth | 350/162 |
| 4,127,436 | 11/1978 | Friel | 156/630 |
| 4,164,364 | 8/1979 | Witte | 350/96.17 |
| 4,278,752 | 7/1981 | Gervay et al. | 430/281 |
| 4,289,841 | 9/1981 | Cohen et al. | 430/253 |
| 4,316,951 | 2/1982 | Cohen et al. | 430/253 |
| 4,445,751 | 5/1984 | Divens et al. | 350/96.17 X |
| 4,472,020 | 9/1984 | Evanchuk | 350/96.12 |
| 4,474,429 | 10/1984 | Yoldas et al. | 350/96.17 X |
| 4,609,252 | 9/1986 | Wong et al. | 350/96.12 |
| 4,621,043 | 11/1986 | Gervay | 430/281 |
| 4,637,681 | 1/1987 | Yamamoto et al. | 350/96.12 |
| 4,645,731 | 2/1987 | Bayless et al. | 430/271 |
| 4,666,236 | 5/1987 | Mikami et al. | 350/96.15 |
| 4,772,086 | 9/1988 | Bellerby et al. | 350/96.17 |
| 4,883,743 | 11/1989 | Booth et al. | 350/96.17 X |

FOREIGN PATENT DOCUMENTS

| | | | |
|---|---|---|---|
| 0130143 | 10/1979 | Japan. | |
| 60-95409 | 5/1985 | Japan. | |
| 63-70808 | 3/1988 | Japan | 350/96.17 |

OTHER PUBLICATIONS

"Planar Branching Network for Multimode Glass Fibers" by F. Auracher discloses alignment grooves in a layer of Riston TM of an optical fiber connector assembly.

"Modified Thick Film Technology for Multimode Integrated Optics" by R. Kersten also discloses alignment grooves in a layer on an optical fiber connector assembly.

B. L. Booth, "Photopolymer Material for Holography", Applied Optics, vol. 14, No. 3, Mar. 1975, pp. 593–601.

E. A. Chandross et al., "Photolocking-A New Technique for Fabricating Optical Waveguide Circuits", Appl. Phys. Lett., vol. 24, No. 2, Jan 15, 1974, pp. 72–74.

(List continued on next page.)

Primary Examiner—John D. Lee
Assistant Examiner—Phan T. Heartney
Attorney, Agent, or Firm—John E. Griffiths

[57] ABSTRACT

Methods of making assemblies and assemblies for interconnecting optical fibers and use in integrated optical systems. The optical fiber connector assemblies include a pedestal having a step supporting an optical waveguide device having a buried waveguide. End portions of the step support means for receiving cores and cladding of optical fibers with the optical axes of the cores in alignment with the optical axis or axes of the waveguide.

15 Claims, 7 Drawing Sheets

OTHER PUBLICATIONS

F. Auracher, "Planar Branching Network for Multimode Glass Fibers", Optics Communications, vol. 17(1), pp. 129–132, 1976.

R. T. Kersten, "Modified Thick Film Technology for Multimode Integrated Optics", Optics Communications, vol. 28(1), pp. 51–54, 1979.

W. S. Colburn et al., "Volume Hologram Formation in Photopolymer Materials", Applied Optics, vol. 10, No. 7, Jul 1971, pp. 1636–1641.

W. J. Tomlinson et al., "Multicomponent Photopolymer Systems for Volume Phase Holograms and Grating Devices", Applied Optics, vol. 15, No. 2, Feb. 1976, pp. 534–541.

W. J. Tomlinson et al., "Photoinduced Refractive Index Increased in Poly(methymethacrylate) and its Applications", Applied Physics Letters, vol. 16, No. 12, pp. 486–489.

5,015,059

OPTICAL FIBER CONNECTOR ASSEMBLIES AND METHODS OF MAKING THE ASSEMBLIES

This is a division of application Ser. No. 144,002, filed Jan. 15, 1988 (now U.S. Pat. No. 4,883,743).

BACKGROUND OF THE INVENTION

1. Field of the Invention

This invention relates to optical fiber connector assemblies for connecting optical fibers in an optical fiber system and methods of making the assemblies and, more particularly, to assemblies using an optical waveguide device between optical fibers.

2. Description of the Prior Art

In optical communication systems, messages are transmitted typically through optical fibers by carrier waves of optical frequencies that are generated by sources, such as lasers or light emitting diodes. There is much current interest in such optical communication systems because they offer several advantages over other communication systems, such as having a greatly increased number of channels of communication and the ability to use other materials besides expensive copper cables for transmitting messages.

As the development of optical circuits proceeded, it became necessary to have optical waVeguide devices which could couple, divide, switch and modulate the optical waves from one optical fiber to another. For example devices see U.S. Pat. Nos. 3,689,264, 4,609,252 and 4,637,681.

Connecting optical fibers to one another or to optical waveguide devices has traditionally been a problem. One method is to fuse or melt fibers together so that light from one fiber can pass to the connected fibers. However, in such a fusion process it is difficult to control the extent of fusion and the exact geometry and reproducibility of the final structure.

U.S. Pat. No. 4,666,236 discloses optical fibers connected to one another through an optical waveguide device. However, it does not permit the use of optical waveguide devices made by other processes.

In view of the foregoing, it is believed advantageous and an object of this invention to provide optical fiber connector assemblies that can use optical waveguide devices known in the art and particularly those described in U.S. Pat. application U.S. Ser. No. 07/144,003, filed Jan. 15, 1988, now abandoned.

Further, it is advantageous and an object of this invention to provide generally impact resistant, low energy loss, optical fiber connector assemblies which easily align and maintain alignment of fiber cores and device waveguides under varying environmental conditions.

SUMMARY OF THE INVENTION

In accordance with the present invention, there is provided an optical fiber connector assembly for connecting optical fibers which is not limited to using just one type of optical waveguide device. More specifically, the present optical fiber connector assembly includes:

a pedestal having two ends, a surface adjacent each of the ends, each of the surfaces for contacting a jacket of an optical fiber, and a raised step between the surfaces; and means for receiving cores and cladding of optical fibers on two end portions of the step near the pedestal surfaces.

One method for making an optical fiber connector assembly of the present invention comprises the steps of:

laminating a radiation sensitive layer capable of forming a stencil relief image to a step of a pedestal;

aligning a mask on the layer, the mask having clear portions for transmitting light and opaque portions for blocking transmission of light;

exposing the layer to light through the clear portions of the mask; and removing unexposed regions of the layer and a region of the layer corresponding to the waveguide leaving remaining exposed regions on two end portions of the step, each exposed region having a groove.

Another method for making an optical fiber connector assembly of the present invention comprises the steps of:

laminating a first mask on a film having an optical waveguide on a first buffer layer on a pedestal, the mask having clear portions substantially corresponding to desired shapes of grooves to be formed in the film for receiving optical fiber claddings and cores;

irradiating the film with ablative radiation through the mask clear portions substantially corresponding to the grooves, such that the film and the buffer layer under the mask clear portions are substantially removed and grooves in the film and buffer layer are formed;

removing the first mask;

laminating a second mask on a second buffer layer, the second mask having clear portions substantially corresponding to the desired shape of the grooves;

irradiating the second buffer layer with ablative radiation through its clear portions, such that the second buffer layer under the second mask clear portions are substantially removed and grooves in the second buffer layer are formed;

removing the second mask; and laminating the second buffer layer on the

Yet another method for making an optical fiber connector assembly of the present invention comprises the steps of:

laminating a first mask on a first photohardenable buffer layer on a photohardenable film having an optical waveguide on a second photohardenable buffer layer on a pedestal, the mask adapted to block actinic radiation through areas corresponding to grooves to be formed in the film and layers for receiving optical fiber claddings and cores and to transmit actinic radiation through areas corresponding to a desired waveguide device including the waveguide and means defining the grooves;

flooding the film and layers with actinic radiation through the mask;

removing the mask; and removing unflooded regions of the film and layers;

such that an optical fiber connector assembly is formed having an optical waveguide device integral with means defining grooves for receiving claddings and cores of optical fibers.

BRIEF DESCRIPTION OF THE DRAWINGS

The invention can be more fully understood from the following detailed description of the invention connection with accompanying drawings which form a part of this application and in which.

DESCRIPTION OF THE PREFERRED EMBODIMENT(S)

Figure 1:
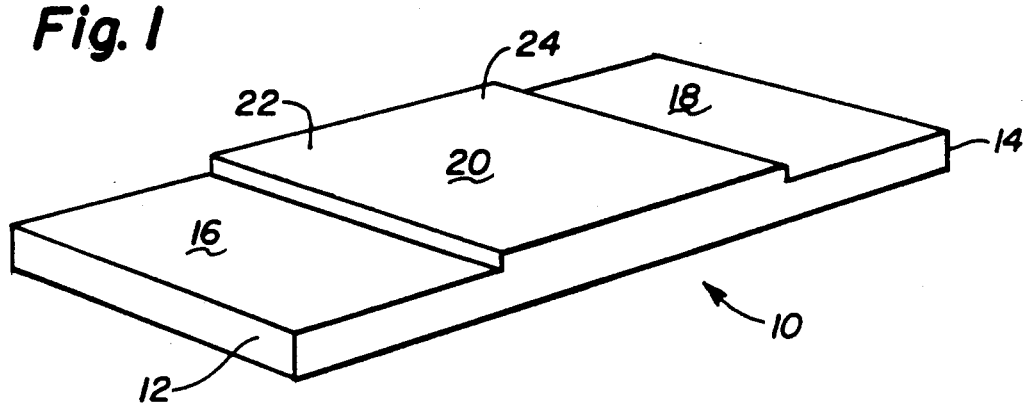
FIG. 1 is a perspective view of a pedestal having a step.

Throughout the following detailed description, similar reference numerals refer to similar elements in all Figures of the drawings.

Referring to FIG. 1, there is illustrated a pedestal 10 having two ends 12 and 14, upper surfaces 16 and 18 adjacent each of the two ends 12 and 14, and a raised step 20 between the surfaces 16 and 18. The step has two end portions 22 and 24, one of the end portions near each of the pedestal surfaces 16 and 18.

The pedestal 10 can be made of any polymeric material having a sufficiently high glass transition temperature, Tg, to provide dimensional stability during temperature cycling up to about 150° C. used in the present process. Typically, a commensurate Tg of about 150° C. or above is desirable for the pedestal material. Such a material used in demonstrating this invention comprises a terpolymer of acrylate, styrene and n-phenylmaleimide. The pedestal 10 may be formed or shaped using any conventional method provided the top of step 20 is substantially flat for receiving subsequent layers. Such methods include molding, stamping, extruding, machining, photoforming or combinations thereof. In particular instances, the pedestal 10 may be prepared from other materials such as glass, metals, ceramics, or the like.

Figure 2:
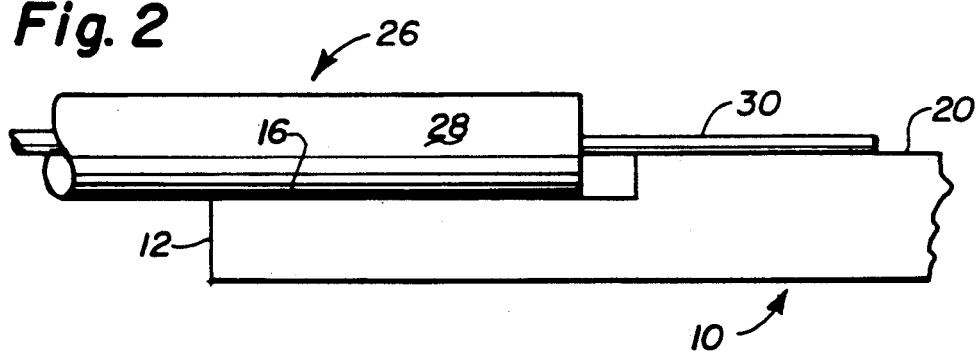
FIG. 2 illustrates the pedestal dimensioned to contact a jacket of an optical fiber on a pedestal surface and cladding of the fiber on the step.

FIG. 2 illustrates that the height of the step 20 is chosen such that when a jacket 28 of an optical fiber 26 is set on the upper surface 16, cladding 30 of the optical fiber 26 rests on the step 20 without significantly bending the cladding 30. The height of the step can be 387.5 microns for optical fiber having a jacket diameter of 900 microns nd cladding diameter of 125 microns.

Figure 3:
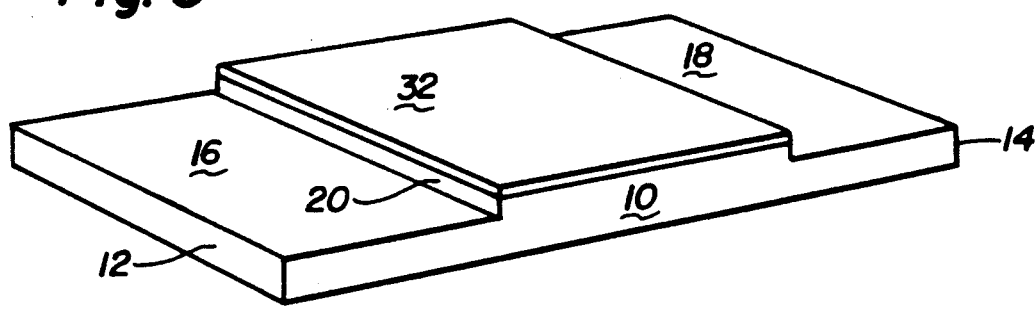
FIG. 3 is a perspective view of the pedestal with a radiation sensitive layer on the pedestal step.
Figure 4:
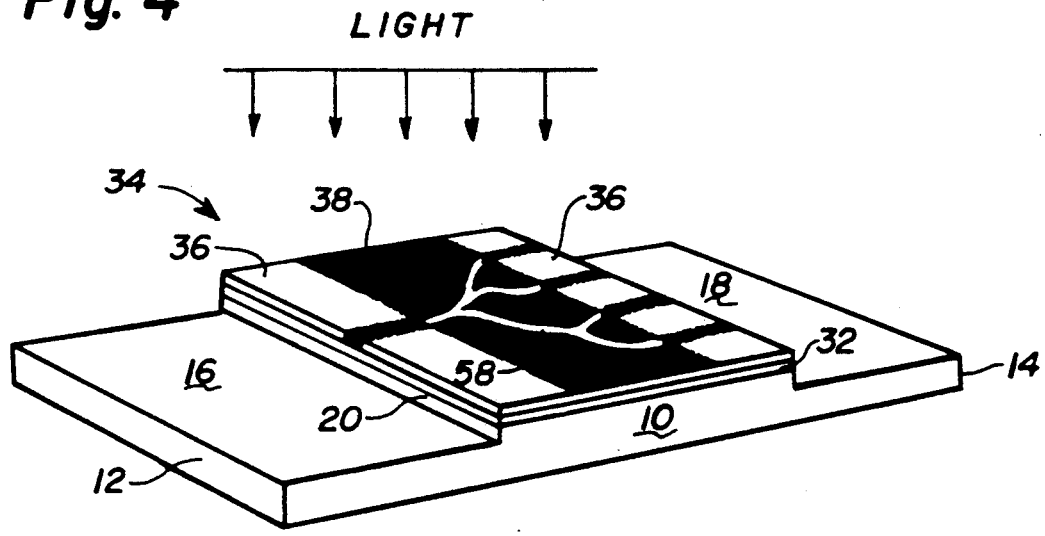
FIG. 4 is a perspective view of the FIG. 3 element being exposed to light through a mask.
Figure 5:
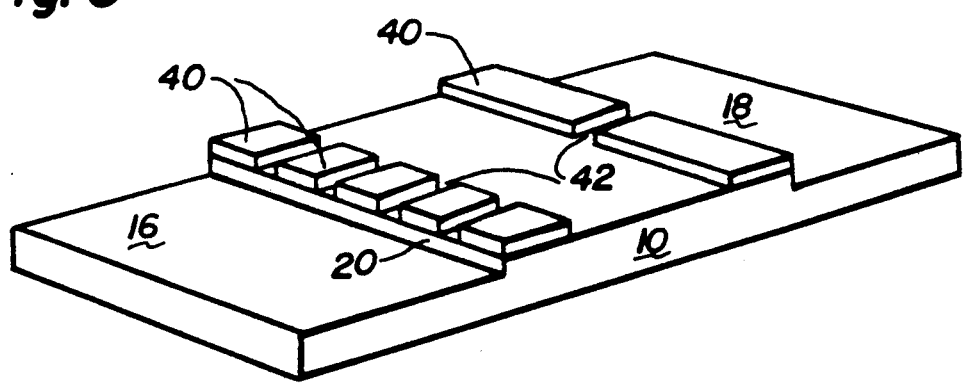
FIG. 5 shows an element resulting from the exposure illustrated in FIG. 4 with the mask, unexposed regions of the layer, and a region of the layer corresponding to the waveguide removed.

FIGS. 3, 4 and 5 shoW one process for making means for receiving the core and cladding of optical fibers in an optical fiber connector assembly of the present invention.

FIG. 3 illustrates the step of laminating a radiation sensitive layer 32 to the step 20 of the pedestal 10.

Then, referring to FIG. 4, a mask 34 is aligned on the layer 32. The mask 34 can be made of a sheet of glass having clear portions 36 adapted to transmit light therethrough. The mask 34 also has opaque portions 38 which are coated with chromium to block or prevent actinic light from transmitting therethrough. The clear portions 36 substantially correspond to a desired or predetermined shape of a waveguide 58 to be formed in a film 74 and to a desired shape of means for receiving optical fibers. While such masks may be used in demonstrating this invention, other phototools may likewise be used of the flexible type, such as disclosed in U.S. patent 4,645,731. Such flexible phototools may be of the silverhalide type, diazo type, or the like.

FIG. 4 additionally shows the step of exposing the layer 34 to light through the clear portions 36 of the mask 34.

After this exposing step, unexposed regions of the layer 32 are remoVed. An exposed region of the layer 32 corresponding to the waveguide 58 is also removed. These regions are removed by washing the layer 32 with a suitable developer solution, such as a solvent for the unreacted material, e.g., 111 trichloroethane, dilute aqueous sodium carbonate, or the like. Any unexposed region of the layer 32 will wash away. The exposed region corresponding to the waveguide 58 washes or brushes away due to its narrow width, e.g., 5 microns. This leaves only the desired pattern of cured or hardened exposed regions which will be used as means for receiving 40 cladding and cores of optical fibers. The receiving means 40 is a layer on the two end portions 22 and 24 of the step 20. Each of the layers has at least one groove 42 for receiving the core and cladding of optical fibers. FIG. 5 depicts one groove 42 in one of the layers and four grooves 42 in the other layer.

Any radiation sensitive material may be used for the layer 32 provided it is capable of forming a stencil relief or resist image that remains firmly adhered to the top of step 20 during processing steps. Typical useful materials are photohardenable and are applied to the step top as a preformed solid layer and which change rheological or solubility characteristics upon exposure to actinic radiation such as disclosed in U.S. Pat. No. 3,469,982 and U.S. Pat. No. 3,526,504 which are incorporated herein by reference. Other photohardenable materials which are also useful are systems such as disclosed in U.S. Pat. No. 3,770,438, U.S. Pat. No. 4,289,841 and U.S. Pat. No. 4,316.951, which are also incorporated herein by reference, wherein the process of forming the stencil image involves a peel-apart step.

Preferred materials for use as layer 32 are thick film photopolymerizable solder mask materials which when processed produce thermally stable adherent images Thick means between about 2 mil (50 μm) and 5 mil (125 μm) or above. Typical of such solder mask formulations are those disclosed in U.S Pat. No. 4,278,752 and U.S. Pat. No. 4,621,043 which are incorporated herein by reference. Such thick film photopolymerizable formulations comprise (a) at least one preformed, macromolecular polymeric material, (b) an ethylenically unsaturated monomer capable of addition polymerization, (c) a photo-initiating system activatable by actinic radiation wherein the monomer (b) further comprises a monomer component containing two or more terminal ethylenically unsaturated groups, particularly preferred thick film photopolymerizable materials would be those formulations wherein the sensitometric, adhesive and thermal characteristics of the processed layer 32 are matched to the same characteristics of the material used to form the optical waveguide device 56. For this purpose, the materials disclosed in copending U.S. patent applications Ser. Nos. 07/144,840, 07/144,281 (now abandoned) and 07/144,355 (now U.S. Pat. No. 4,942,112), all filed on Jan. 15, 1988, which are incorporated herein by reference, may be used in the form of a thick film layer sandwiched between a removable coversheet and a removable support film.

For the purpose of demonstrating this invention, thick photopolymerizable films or layers are prepared having a three-ply structure consisting of, in order, a polyethylene terephthalate temporary support sheet, a uniformly thick (e.g., 50 $\mu$m or 75 $\mu$m) photopolymerizable film or layer and a polyethylene protective cover sheet. The photo-polymerizable film or layer may be a composition as disclosed in, or similar to those disclosed in, U.S. Pat. No. 4,278,752.

When a 125 $\mu$m thick film is not available, in order to achieve the thickness of 125 $\mu$m needed for layer 32, a 50 $\mu$m thick film type and a 75 $\mu$m film type may be laminated to the top of step 20 in sequence using vacuum lamination as disclosed in U.S. Pat. No. 4,127,436. In this procedure, the cover sheet of either the 50 $\mu$m or 75 $\mu$m film is first removed and the photopolymerizable film is laminated to the step top and the temporary support is removed therefrom. The cover sheet is removed from the second remaining film and the second photopolymerizable film is laminated to the uncovered surface of the initial film to produce a composite 125 $\mu$m photopolymerizable layer 32 on the top of step 20 having a temporary support releasedly adhered to the composite. The composite photopolymerizable layer 32 is then conventionally exposed to actinic radiation (e.g., in an Optibeam ORC exposure unit at 500 to 600 m jouls incident radiation) passing through mask 34 as in FIG. 4 either before or after removing the temporary support film. After removing the mask 34 and/or temporary support film from exposed photopolymerizable layer 32, the layer 32 is developed in a spray of 1,1,1-trichloroethane which dissolves the unexposed portions of layer 32. By this process, grooves can be formed having a trapezoid cross section with a narrow entrance at the top creating a three-point contact of an optical fiber inserted into the trapezoidal groove. Thus, the resulting means for receiving can be photohardened layers containing photopolymerized or photocrosslinked monomer groups.

Figure 6:
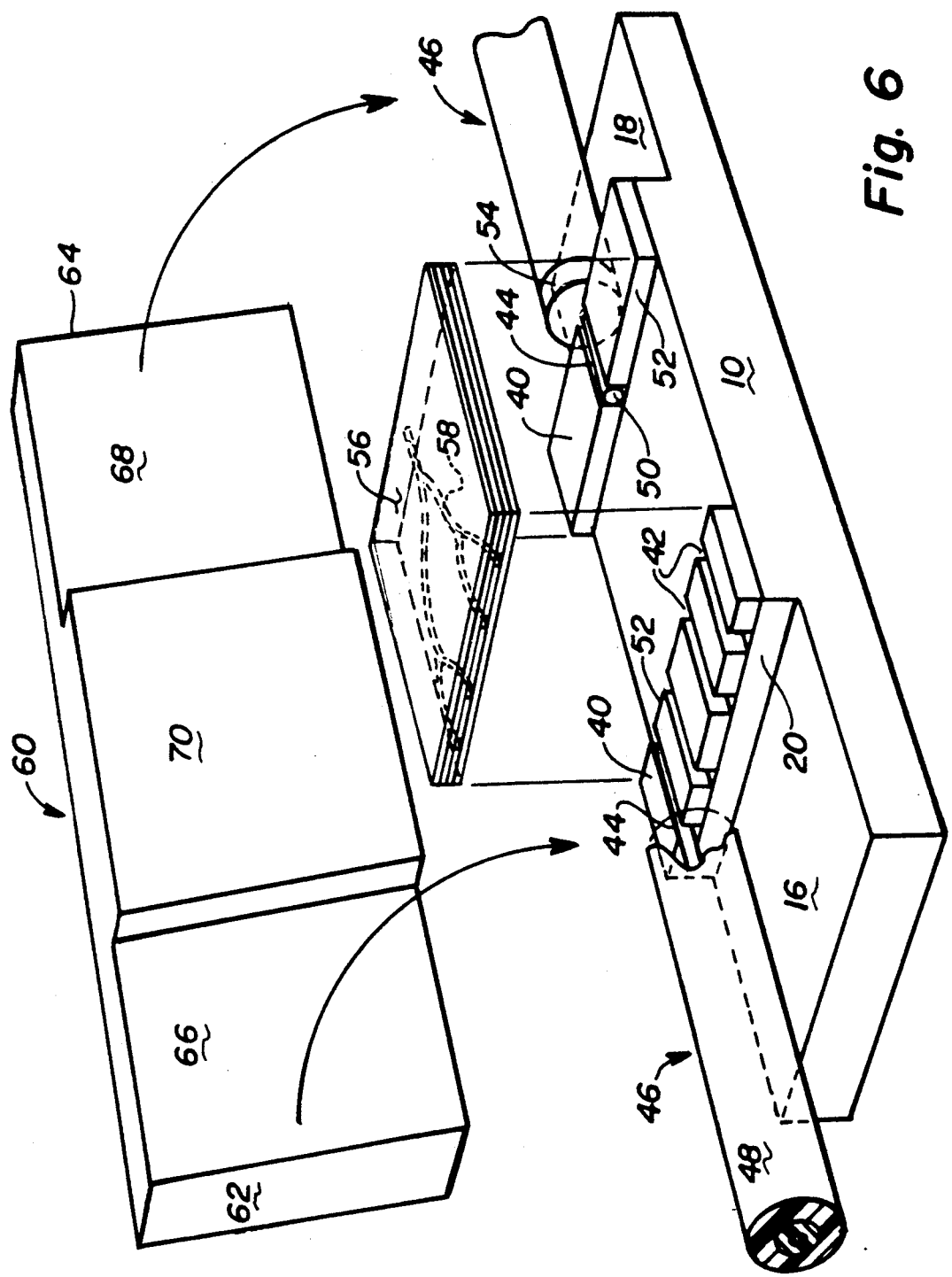
FIG. 6 illustrates combining the element resulting from FIG. 5, an optical waveguide device, optical fibers and a cover.

FIG. 6 shows one embodiment of an optical fiber connector assembly of the present invention being assembled.

A core and cladding 44 of an optical fiber 46 is inserted or placed in each of the grooves 42 of the receiving means 40. Jackets 48 of the optical fibers 46 set or lay on the pedestal surfaces 16 and 18. The cores and cladding 44 are positioned such that their distal ends 50 are nearly flush with inner walls 52 of the receiving means 40. The optical fibers 46 can be secured to the pedestal 10 such as, by clamps or using an ultraviolet light curable epoxy 54 between the jackets 48 and the step 20 or pedestal surfaces 16 and 18.

An optical waveguide deVice 56 is located on the step 20 between the inner walls 52 of the receiving means 40. The device 56 includes at least one buried optical waveguide 58 for transmitting light therethrough. The device 56 is positioned such that optical axes of the optical fiber cores are substantially in alignment with optical axes of the waveguide(s) 58 within the device 56. The device 56 is secured to the pedestal 10, such as, by light and/or heat curable epoxy.

A cover 60 can optionally be placed on the above described assembly. The cover 60 can be substantially identical in shape to the pedestal 10, but be used upside down in comparison to the pedestal 10. Thus, the cover 60 can have two ends 62 and 64, and a cover surface 66 and 68 adjacent each of the two ends 62 and 64, and a cover step 70 between the cover surfaces 66 and 68. The cover step 70 contacts the device 56 and the cover surfaces 66 and 68 contact the optical fiber jackets 48. Securing means, like epoxy, can secure the optical fibers to the cover 60.

Optical waveguide devices 56 known in the art can be used in the subject optical fiber connector assembly. However, a preferred device is made as described in a copending U.S. Pat. application U.S. Ser. No. 07/144,003, filed Jan. 15, 1988, now abandoned, which is hereby incorporated by reference. The preferred device 56 and its manufacture will now be described in reference to FIGS. 7 and 8.

Figure 7:
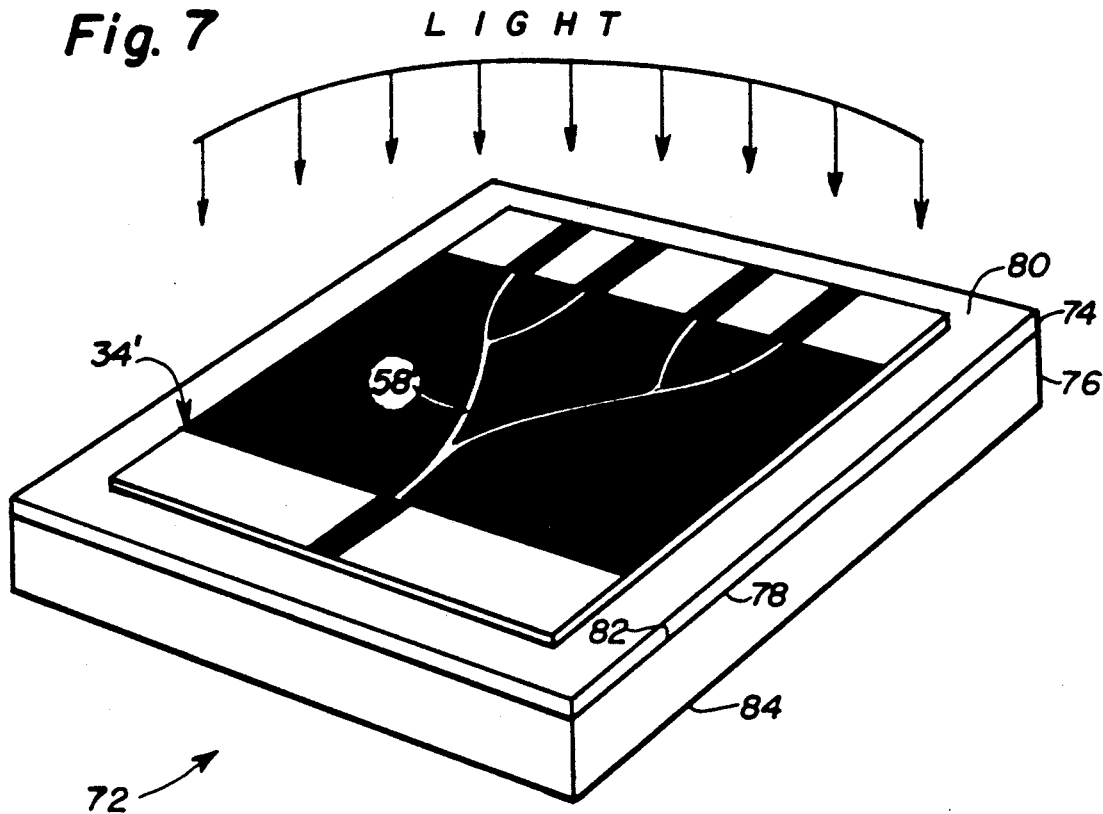
FIG. 7 is a perspective view of a substantially dry photohardenable film removably adhered to a support, the film being exposed to light through a mask.

Referring to FIG. 7, there is illustrated an element 72 comprising a substantially dry photo-hardenable film 74 removably adhered to a support 76. The film 74 has a first surface 78 and a second surface 80. The support similarly has a first surface 82 and a second surface 84. The first surface 82 of the support 76 is removably adhered to the first surface 78 of the film 74.

A mask 34' is placed on the film second surface 80, pressure is controllably applied to the mask with nip rollers to remove air from between the mask 34 and film 74. Preferably, the mask 34' is the same mask as the one used on layer 32 previously described.

A region of the film 74 is exposed to light through the clear portions of the mask 34' polymerizing at least one monomer in the film and changing the refractive index of the region to form an optical waveguide 58'. Then the mask 34' is removed.

Figure 8:
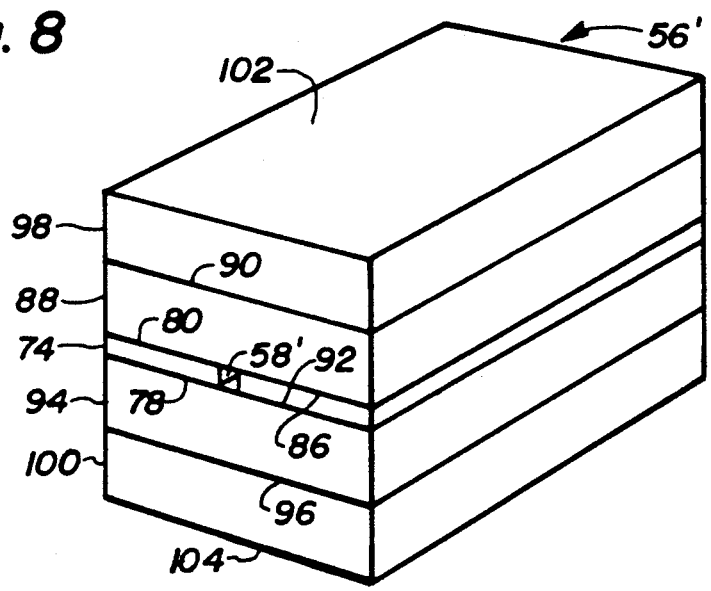
FIG. 8 shows an optical waveguide device comprising two upper buffer layers, a film having a waveguide and two lower buffer layers.

Referring to FIG. 8, a first surface 86 of a first substantially dry photohardenable buffer layer 88 is laminated to the second film surface 80, with a support removably adhered to a second surface 90 of the first buffer layer 88.

The support 76 is removed from the first film surface 78.

A first surface 92 of a second substantially dry photohardenable buffer layer 94 is laminated to the first film surface 78, with a support removably adhered to a second surface 96 of the second buffer layer 94.

The support is removed from the second surface 90 of the first buffer layer 88. Then a third substantially dry photohardenable buffer layer 98 is laminated thereon.

Similarly, the support is removed from the second surface 96 of the second buffer layer 94. Then a fourth substantially dry photohardenable buffer layer 100 is laminated thereon.

The device is hardened by flooding it with light and/or heating it substantially fixing the indexes of refraction of the buffer layers and the film.

Any supports on outer surfaces 102 and 104 of buffer layers 98 and 100 are removed. The device can then be thermally stabilized by exposure to heat.

If needed, the device or matrix is cut, such as, with glass or a diamond knife to have smooth edges and to provide optical access to the waveguide 58' resulting in the device 56' depicted in FIG. 8.

The thickness of the film 74 can be about 5.3 microns and the thickness of each of the buffer layers can be about 30 microns creating about a 125 micron thick matrix to match the optical fiber dimensions, such as, for single mode operation.

When the same mask 34 is used for forming the waveguide 58 and forming the receiving means 40, then portions of the mask 34 must be clear corresponding to the desired waveguide and the regions of the layer 32 desired to be exposed. All other regions of the mask 34 must be opaque to actinic radiation.

Figure 9:
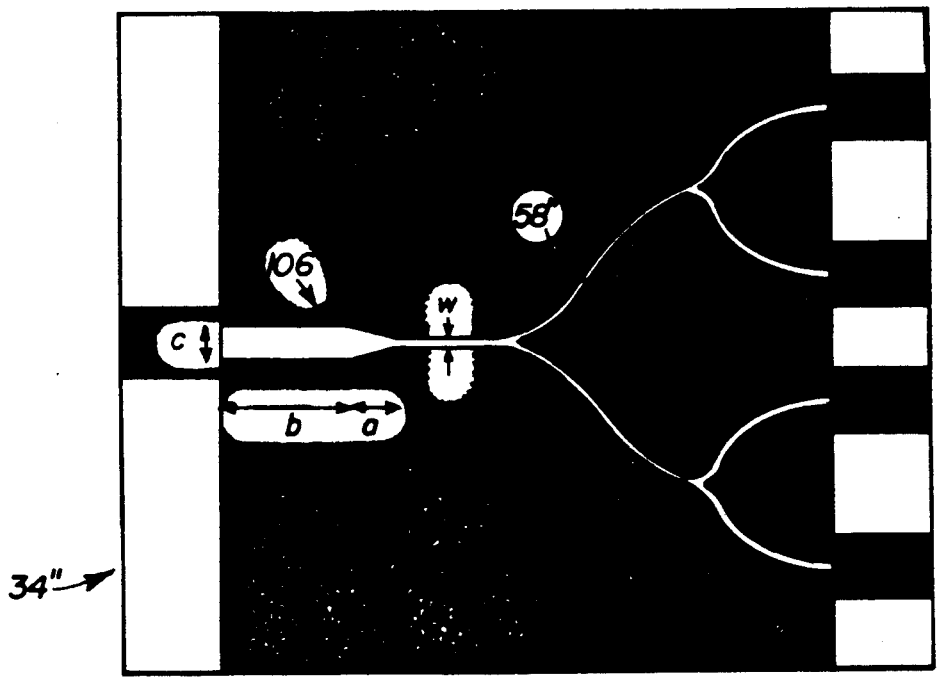
FIG. 9 is a top view of a preferred mask showing clear and opaque portions.

FIG. 9 illustrates a preferred mask 34" which is identical to mask 34, except the dimensions of at least one of the waveguide ends 106. To facilitate light input or output coupling and increase position tolerance of the optical fibers 46 and the waveguide 58", an end 106 of the waveguide 58" forming portion can flair to an expanded Width, c, of about 15 microns or less in a length, a, of about 1.5 millimeters then remain its expanded width for about 100 microns in length, b. For single mode operation, the remainder of the resulting Waveguide 58" must be about 5 microns wide, w. Thus, the clear portion of the mask 34" from which the remainder of the waveguide 58 is formed must be about 5 microns wide.

FIGS. 4, 7 and 9, each, depict masks for forming a 1 to 4 splitter or divider waveguide. The waveguide formed through these masks have five ends adapted to input and output light. Each one of the waveguide ends are connected to the other waveguide ends. One of the waveguide ends is adjacent one of the two end portions of the step 20. The other four waveguide ends are adjacent to the other one of the two end portions of the step 20. As illustrated light injected into the one waveguide end is divided in the waveguide and exits through the other four waveguide ends and light injected into each of !he other four waveguide ends exits through the one waveguide end.

The portions of the masks which are opaque and correspond to the grooves to be formed are generally rectangular being about 125 microns wide.

Figure 10:
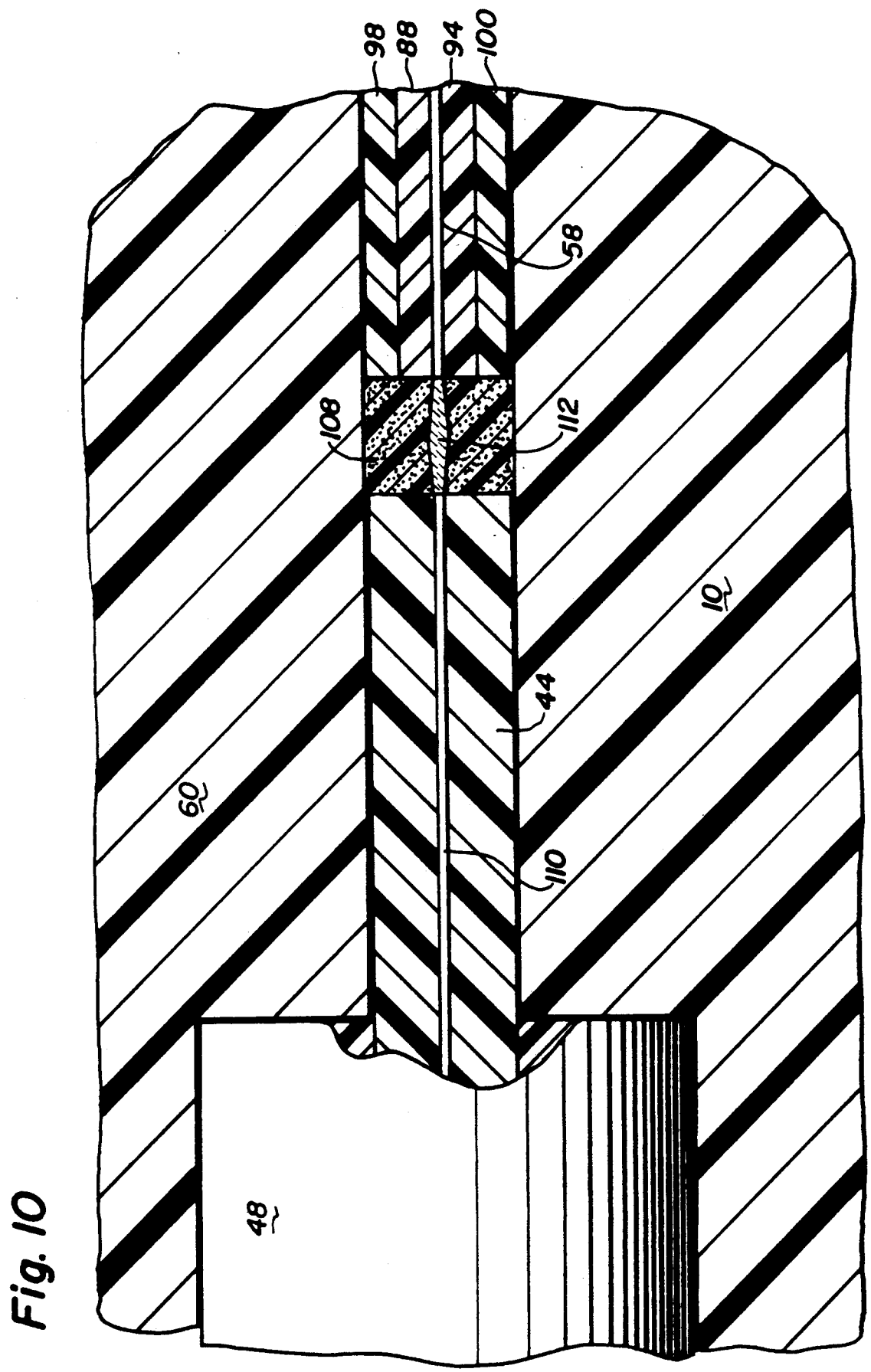
FIG. 10 is an enlarged view of a portion of the assembly of FIG. 6 when assembled showing an optical via between the fiber core and the waveguide.

Referring to FIG. 10, before the cover 60 is placed on the assembly, a photohardenable medium, either liquid or substantially dry solid lOB can be inserted between the cores. e.g., 110, of the optical fibers 46 and the waveguide 58. One approach for inserting the liquid 108 is by dipping the fiber into a bath of the liquid before placing the fiber in the groove. Once inserted the liquid or substantially dry solid is exposed to light through the optical fibers 46 from both sides of the device 56, preferably simultaneously. This forms an optical via, bridge or link 112 of higher refractive index capable of guiding light between each core 110 and the waveguide 58. After the vias are formed, the assembly can be flooded with light or heated to further harden the medium 108, thus, embedding the via in the matrix assembly. Then the assembly can be beat stabilized by heating the assembly at a temperature in the range of about 50° C.

through 200° C. for a duration of minutes through hours. If materials are used for assembly parts which are not dimensionally stable upon heating, e.g., they shrink or expand in the plane of the radiation sensitive layer 32. The photopolymerizable layer 32 may still be used for the receiving means 40, but a separate mask may be required in order to position the grooves 42 and compensate for material dimension changes.

Figure 11:
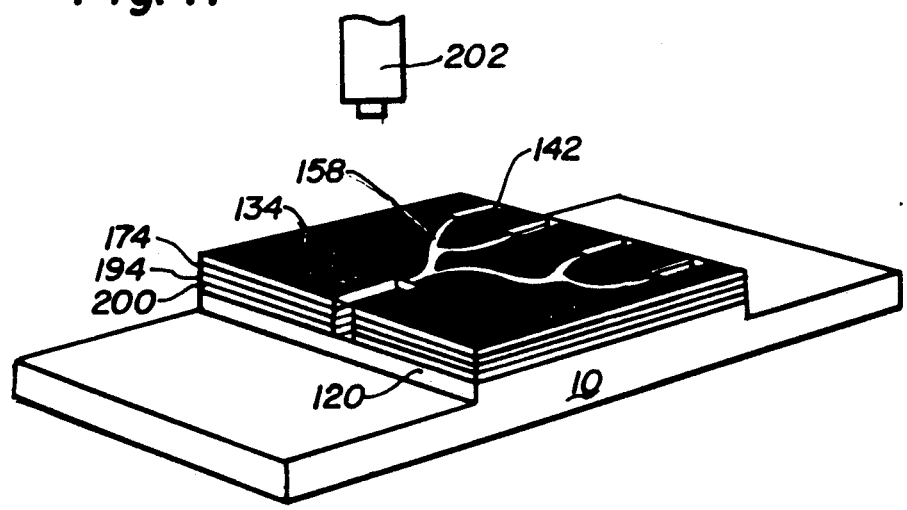
FIG. 11 shows a mask, a film and two buffer layers on a step of a pedestal, the film and layers being irradiated with excimer laser light.
Figure 12:
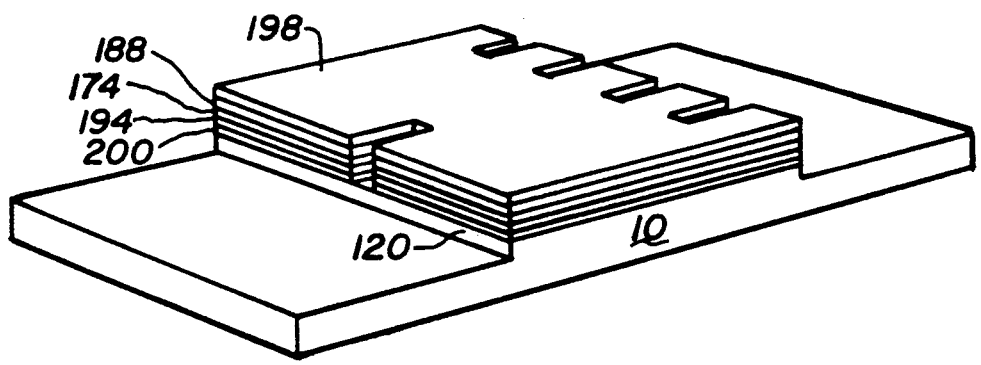
FIG. 12 is an optical fiber connector assembly comprising a pedestal, two lower buffer layers, a film, and two upper buffer layers, the film and layers having grooves for receiving cladding and cores of optical fibers.

FIG. 11 and 12 illustrate another process for making means for receiving the core and cladding of optical fibers in an optical fiber connector assembly of the present invention.

In this process, a substantially dry photohardenable film 174 on two substantially dry photohardenable buffer layers 194 and 200 are laminated on the step 20 of the pedestal 10.

This can be accomplished by laminating a first surface of buffer layer 200 to the step 20, with a support removably adhered to a second surface of buffer layer 200. The support is then removed A first surface of buffer layer 194 is then laminated on the second surface of buffer layer 200, with a support remoVably adhered to a second surface of buffer layer 194. The buffer layers 194 and 200 are then hardened by flooding them with light or heating them. The support is removed from buffer layer 194 and film 174 is laminated in its place. Any support on film 174 is removed. Then a mask 134 is located on the film 174. The mask 134 having clear portions substantially corresponding to a desired shape of an optical waveguide 158 and grooves 142, The remainder of the mask 134 is opaque The film 174 is exposed to light through the mask clear portions polymeriZing at least one monomer in the film 174 and changing the refractive index of the exposed film to form the optical waveguide 158.

Alternatively, the mask 134 is laminated on the film 174, the film 174 removably adhered to a support. The film 174 is then exposed to light through the mask clear portions. The two buffer layers 194 and 200 are either laminated onto the step 20 or substituted for the support on the film 174. If the former, then the support is removed from the film 174 and the film is laminated on the buffer layer 194. If the latter, then the buffer layer 200 is laminated to the step 20. The buffer layers and film are hardened by flooding with light or heating at some stage of the process, but the film is not hardened before the waveguide is formed.

The Waveguide portion of the mask 134 is then blocked to prevent light from transmitting thereIhrough.

Then ablative radiation provided by any source, such as an excimer laser, a high energy ultraviolet light typically at 250 manometers wavelength, an ion or electron beam, or the like, is directed on the groove portions of the mask 134 to degrade the film 174 and buffer layers 194 and 200 under the clear groove portions of the mask 134 and produce fugative volatile components which exit the exposed portions of the film layers. In effect, the exposed film and layers are substantially etched or removed. This forms grooves 142 defined by receiving means precisely aligned with the waveguide 158.

The mask 158 is removed. Two more buffer layers 188 and 198 are laminated onto the film 174 and then hardened. The mask 158 is placed onto buffer layer 198 aligning the clear groove portions over the grooves already removed or etched out. Fiduciary marks can be used on the mask 158, film 174 and layers 194 and 200 to facilitate alignment.

It may be advantageous to use a slightly different mask to remove groove portions from buffer layers 188 and 198. Using a mask on buffer layers 188 and 198 with clear groove portions slightly wider than the clear groove portions used on film 174 and buffer layers 194 and 200 will facilitate positioning of the groove portions in buffer layers 188 and 198 entirely over the groove portions previously formed in the film 174 and buffer layers 194 and 200.

The buffer layers 188 and 198 are then irradiated through the clear groove portions of the mask 158 by the ablative radiation 202 substantially removing the buffer layers 188 and 198 under the clear groove portions of the mask 158 forming grooves defined by receiving means. In this assembly, the receiving means is integral with the optical waveguide device.

Optical fibers 46 and cover 60 are positioned as described in reference to FIG. 6. Vias can be formed to optically connect the optical fiber cores and the waveguide as previously described.

Alternatively, buffer layers 188 and 198 can be laminated onto a cover 160. Mask 158 or a mask with slightly larger clear groove portions is then laminated to the free surface of either buffer layer 188 or 198 farthest from the cover 160. The groove portions of buffer layers 188 and 198 are then substantially etched out as above described. Then the buffer layers 188 and 198 are hardened. The mask is then removed. Optical fibers 46 are positioned and secured in the partial receiving means on the pedestal 110 or cover 160. Then the remaining part, i.e., the cover 160 or pedestal 110, is connected, such that the receiving means on the pedestal 110 and the receiving means on the cover enclose the claddings of the optical fibers.

The assembly illustrated in FIG. 12 can also be made by removing groove portions from the film 174 and buffer layers 200, 194, 188 and 198 by chemically washing them out similar to as previously described with respect to FIGS. 4 and 5.

Specifically, a mask is laminated on a first photohardenable buffer layer on a photohardenable film having an optical waveguide on a second photohardenable buffer layer on a pedestal. The mask is adapted to block actinic radiation through areas corresponding to grooves to be formed in the film and layers for receiving optical fiber claddings and cores. The mask is also adapted to transmit actinic radiation through areas corresponding to a desired waveguide device including the waveguide and means defining the grooves. The film and layers are flooded with broad band ultraviolet light, i.e., actinic radiation, through the mask. This hardens the film and layers. The mask is removed. Then the unflooded regions of the film and layers are removed by washing with an appropriate solvent. An optical fiber connector assembly results having an optical waveguide device integral with means defining grooves for receiving claddings and cores of optical fibers.

As with previously described assemblies, a core and cladding of an optical fiber can be placed in the grooves while jackets of the optical fibers are set on pedestal surfaces adjacent two ends of the pedestal.

Figure 13:
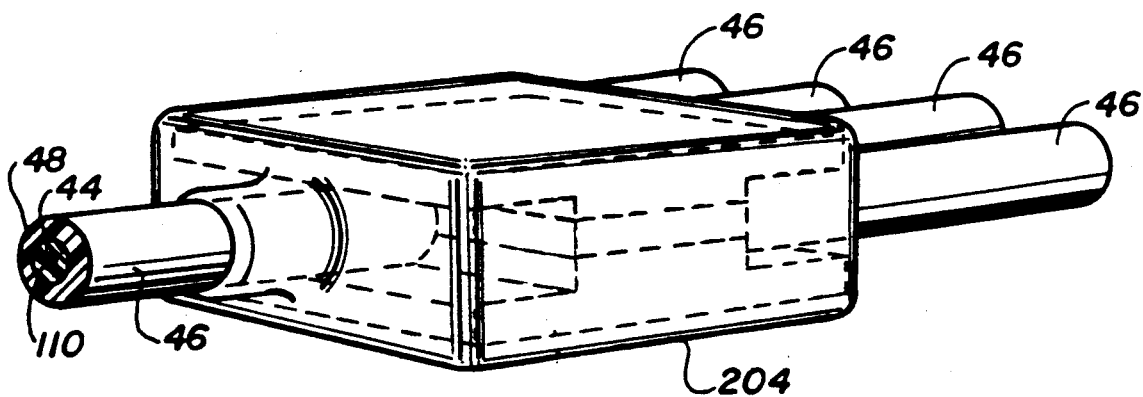
FIG. 13 shows the optical fiber connector assembly of FIG. 12 with a cover and hermetically sealed in potting material.

All parts of the assembly or assemblies of the present invention can be bonded or sealed with a hardened photopolymer. Parts can be enclosed from the environment by hardened photopolymer or other material 204, such as epoxy. This can be accomplished by dipping the assembly with or without a cover in a suitable curable liquid. See FIG. 13.

Those skilled in the art, having the benefit of the teachings of the present invention as hereinabove set forth, can effect numerous modifications thereto. These modifications are to be construed as being encompassed within the scope of the present invention as set forth in the appended claims.

I claim:

1. An optical fiber connector assembly for connecting optical fibers having a core, cladding and a jacket in an optical fiber system comprising:

a pedestal having two ends, a surface adjacent each of the ends, each of the surfaces for contacting the jacket of one of the optical fibers, and a raised step between the surfaces;

means for receiving the core and the cladding of the optical fibers on two end portions of the step near the pedestal surfaces; and an optical waveguide device on the step between the end portions, the device having a buried waveguide having an optical axis, the device further comprising:

a photohardened film including the waveguide having ends; and four photohardened buffer layers, two of the layers laminated on one side of the film, two of the layers laminated on another side of the film, the layers and the film enclosing the waveguide except at the waveguide ends, such that when the cores and the claddings are in the means for receiving on the two end portions of the step, optical axes of the cores are substantially in alignment with the optical axis of the buried waveguide.

2. The optical fiber connector assembly as in claim 1, wherein:

the means for receiving are photohardened layers containing photopolymerized or photocrosslinked monomer groups.

3. The optical fiber connector assembly as set forth in claim 1, wherein:

the means for receiving is a layer on the two end portions of the step, each one of the layers having a groove for receiving the core and the cladding of the optical fibers.

4. The optical fiber connector assembly as set for claim 1, wherein:

the means for receiving is a layer on the two end portions of the step, one of the layers having one groove for receiving the core and the cladding of one optical fiber and the other layer having four grooves for receiving the core and the cladding of four optical fibers.

5. An optical fiber connector assembly for connecting optical fibers having a core, cladding and a jacket in an optical fiber system comprising:

a pedestal having two ends, a surface adjacent each of the ends, each of the surfaces for contacting the jacket of one of the optical fibers, and a raised step between the surfaces, wherein the pedestal is a terpolymer comprising acrylate, styrene and n-phenylmaleimide which remains substantially dimensionally stable upon exposure to heat up to about 150° C; and means for receiving the core and the cladding of the optical fibers on two end portions of the step near the pedestal surfaces, such that when the cores and the claddings are in the means for receiving on the two end portions of the step, optical axes of the cores are substantially in alignment with the optical axis of the buried waveguide.

6. An optical fiber connector assembly for connecting optical fibers having a core, cladding and a jacket in an optical fiber system comprising:

a pedestal having two ends, a surface adjacent each of the ends, each of the surfaces for contacting the jacket of one of the optical fibers, and a raised step between the surfaces;

means for receiving the core and the cladding of the optical fibers on two end portions of the step near the pedestal surfaces; and an optical waveguide device on the step between the end portions, the device having a buried waveguide having an optical axis, wherein the buried waveguide has five ends adapted to input and output light, each one of the waveguide ends are connected to the other waveguide ends, one of the waveguide ends is adjacent one of the two end portions of the step, the other four waveguide ends are adjacent to the other one of the two end portions of the step, such that light injected into the one waveguide end is divided in the waveguide and exits through the other four waveguide ends and light injected into each of the other four waveguide ends exits through the one waveguide end, such that when the cores and the claddings are in the means for receiving on the two end portions of the step, optical axes of the cores are substantially in alignment with the optical axis of the buried waveguide.

7. An optical fiber connector assembly for connecting optical fibers having a core, cladding and a jacket in an optical fiber system comprising:

a pedestal having two ends, a surface adjacent each of the ends, each of the surfaces for contacting the jacket of one of the optical fibers, and a raised step between the surfaces;

means for receiving the core and the cladding of the optical fibers on two end portions of the step near the pedestal surfaces;

an optical waveguide device on the step between the end portions, the device having a buried waveguide having an optical axis; and a cover having two ends, a cover surface adjacent each of the two ends, each of the cover surfaces for contacting the jacket of one of the optical fibers, and a cover step between the cover surfaces, the cover step contacting the device, such that when the cores and the cladding are in the means for receiving on the two end portions of the step, optical axes of the cores are substantially in alignment with the optical axis of the buried waveguide.

8. An optical fiber connector assembly for connecting optical fibers having a core, cladding and a jacket in an optical fiber system comprising:

a pedestal having two ends, a surface adjacent each of the ends, each of the surfaces for contacting the jacket of one of the optical fibers, and a raised step between the surfaces;

means for receiving the core and the cladding of the optical fibers one two end portions of the step near the pedestal surfaces; and an optical waveguide device on the step between the end portions, the device having a buried waveguide having an optical axis, wherein the waveguide is about 5.3 microns thick and about 5 microns wide except one end flares to form a taper to facilitate input coupling, such that when the cores and the claddings are in the means for receiving on the two end portions of the step, optical axes of the cores are substantially in alignment with the optical axis of the buried waveguide.

9. The optical fiber connector assembly as set forth in claim 8, wherein:

the waveguide one end flares to an expanded width of less than about 15 microns in a length of about 1.5 millimeters, then remains its expanded width for about 100 microns.

10. An optical fiber connector assembly for connecting optical fibers having a core, cladding and a jacket in an optical fiber system comprising:

a pedestal having two ends, a surface adjacent each of the ends, each of the surfaces for contacting the jacket of one of the optical fibers, and a raised step between the surfaces;

means for receiving the core and the cladding of the optical fibers on two end portions of the step near the pedestal surfaces;

an optical waveguide device on the step between the end portions, the device having a buried waveguide having an optical axis;

first and second optical fibers, each of the fibers having a jacket, cladding and a core;

the first fiber contacting one of the pedestal surfaces and received by the means for receiving near the one pedestal surface; and the second fiber contacting the other pedestal surface and received by the means for receiving near the other pedestal surface, such that when the cores and the claddings are in the means for receiving on the two end portions of the step, optical axes of the cores are substantially in alignment with the optical axis of the buried waveguide.

11. The optical fiber connector assembly as set forth in claim 10, further comprising:

means for securing the fibers to the pedestal.

12. The optical fiber connector assembly as set forth in claim 11, wherein:

the means for securing comprises an ultraviolet curable epoxy.

13. The optical fiber connector assembly as set forth in claim 10, further comprising:

optical vias connecting the fiber cores to ends of the waveguide.

14. The optical fiber connector assembly as set forth in claim 10, further comprising:

means for hermetically sealing the pedestal, the means for receiving, the device and the optical fibers.

15. An optical fiber connector assembly for connecting optical fibers having a core, cladding and a jacket in an optical fiber system comprising:

a pedestal having two ends, a surface adjacent each of the ends, each of the surfaces for contacting the jacket of one of the optical fibers, and a raised step between the surfaces;

means for receiving the core and the cladding of the optical fibers on two end portions of the step near the pedestal surfaces; and an optical waveguide device on the step between the end portions, the device having a buried waveguide having an optical axis, wherein the optical waveguide device is integral with the means for receiving, such that when the cores and the cladding are in the means for receiving on the two end portions of the step, optical axes of the cores are substantially in alignment with the optical axis of the buried waveguide.

* * * * *